United States Patent [19]

Bernier

[11] Patent Number: 5,338,964
[45] Date of Patent: Aug. 16, 1994

[54] INTEGRATED CIRCUIT COMPRISING A PROTECTION DIODE ARRAY

[75] Inventor: Eric Bernier, Tours, France

[73] Assignee: SGS-Thomson Microelectronics S.A., Saint-Genis Pouilly, France

[21] Appl. No.: 37,082

[22] Filed: Mar. 25, 1993

[30] Foreign Application Priority Data

Mar. 26, 1992 [FR] France .................. 92 04130

[51] Int. Cl.⁵ ................ H01L 29/161; H01L 29/205; H01L 29/225
[52] U.S. Cl. .................. 257/476; 257/355; 257/481; 257/484; 257/603
[58] Field of Search .............. 257/203, 355, 356, 476, 257/480, 481, 484, 916, 603

[56] References Cited

FOREIGN PATENT DOCUMENTS 1-152659  6/1989  Japan .................. 257/481
2184599  1/1987  United Kingdom ...... 257/476

OTHER PUBLICATIONS

Patent Abstracts of Japan, vol. 12, No. 24 (E-576) Jan. 23, 1988 & JP-A-62 179 756 (Sanyo Electric).

Primary Examiner—J. Carroll
Attorney, Agent, or Firm—Wolf, Greenfield & Sacks

[57] ABSTRACT

An integrated circuit including an array of diodes includes first Schottky diodes, each of which is connected by its cathode to a point to be protected and by its anode to a reference voltage, and second Schottky diodes, each of which is connected by its anode to a point to be protected and by its cathode to the cathode of an avalanche diode, the anode of which is connected to the reference voltage. This integrated circuit includes, in a P-type substrate, a first and a second group of N-type wells; an ohmic contact and a Schottky contact on each well; an N-type region on the upper surface of the substrate; a metallization connecting the ohmic contacts of the first group of wells to the N-type region; a metallization connecting the Schottky contacts of the second wells; metallizations respectively connecting a Schottky contact of the second group of wells to an ohmic contact of the first wells; and a rear surface metallization.

20 Claims, 2 Drawing Sheets

INTEGRATED CIRCUIT COMPRISING A PROTECTION DIODE ARRAY

BACKGROUND OF THE INVENTION

1. Field of the Invention

The present invention relates to protection circuits and more particularly to diode arrays used for protecting data processing systems.

2. Discussion of the Related Art

In data processing systems, connectors are often coupled to a large number of lines, the voltage of which is liable to vary between first and second states corresponding to first and second voltages.

The case where the first voltage corresponds to ground and the second voltage is a positive voltage, for example +5 volts, will be more particularly considered. But it will be understood that more generally, the voltages of these lines can vary between a high voltage and a low voltage, or reference voltage.

FIG. 1 shows a conventional protection circuit for a line of this type. Line L is connected to the reference voltage (or ground) through a reversely biased diode (d1) and is also connected to ground through a forward biased diode (d'1) in series with a reversely biased avalanche diode (Z) having a voltage close to (slightly higher than) the high voltage on the line. Thus, a negative overvoltage on line L flows to ground through diode d1 and a positive voltage, having a value higher than the nominal voltage of the line, flows through diode d'1 and the avalanche diode Z.

In data processing systems, a very large number of lines are coupled to a connector and it is necessary to combine various protection components such as the one of FIG. 1, all sharing a single avalanche diode. Such a circuit is illustrated in FIG. 2, where is shown, in association with each line L1–L8, a diode d1–d8 reverse-biased connected to ground and a diode d'1–d'8 forward-biased connected through an avalanche diode Z to ground.

In practice, it has been noted that it is more advantageous to select for diodes d1–d8 and d'1–d'8 Schottky-type diodes so as to decrease as much as possible the capacitance between each line and ground, and therefore to minimize the crosstalk phenomena liable to occur between two or several lines. Additionally, such small-size Schottky diodes have a relatively low forward voltage drop, hardly higher than that of a conventional junction diode.

Presently, this type of circuit is implemented with discrete components. This involves a cumbersome structure and expensive labor costs to carry out the various soldering operations required for production of the circuit. These are conventional drawbacks of discrete components as compared to an integrated component. Yet another drawback is that the small-size Schottky diodes are fragile components and very sensitive to reverse overvoltages that are liable to destroy them. Therefore, the circuit must be manufactured and connected with the greatest care so as not to impair or damage its elementary components.

SUMMARY OF THE INVENTION

An object of the present invention is to provide a diode array such as shown in FIG. 2 in an integrated form.

To achieve this object, the invention provides an integrated circuit comprising a diode array including first Schottky diodes, each of which is connected by its cathode to a point to be protected, and by its anode to a reference voltage; and second Schottky diodes, each of which is connected by its anode to a point to be protected and by its cathode to the cathode of an avalanche diode, the anode of which is connected to the reference voltage. This integrated circuit includes a low doped P-type substrate, the lower surface of which is highly doped; a first and a second group of low doped N-type wells formed in the upper surface of the substrate; an ohmic contact and a Schottky contact on each well; a highly doped N-type region on the upper surface of the substrate; a first metallization connecting the ohmic contacts of the first group of wells to the highly doped N-type region; a second metallization connecting the Schottky contacts of the second group of wells; third metallizations respectively connecting a Schottky contact of the second group of wells to an ohmic contact of the first group of wells; and a fourth rear surface metallization.

According to an embodiment of the invention, the rear surface and the second metallization are connected to a reference voltage, and each third metallization is connected to a line to be protected.

According to an embodiment of the invention, the first wells form one single well.

According to an embodiment of the invention, the connection between the second metallization and the reference voltage is achieved by a contact between this second metallization and an overdoped region of the upper surface of the substrate.

An integrated circuit according to the invention has, over a discrete circuit according to the prior art, the advantages of being less expensive, less cumbersome and simpler to produce. Additionally, since the Schottky diodes are preassembled with an avalanche diode, they no longer at risk of being destroyed by overvoltages when they are handled and connected to the lines to be protected.

The foregoing and other objects, features, aspects and advantages of the invention will become apparent from the following detailed description of the present invention which should be read in conjunction with the accompanying drawings.

As conventional in integrated circuit representation, the various components are not drawn to scale either inside one figure or from one figure to the other. In particular, the shapes of the various regions and wells are schematically represented with squared edges. It will be clear to those skilled in the art that in practice these edges are rounded up further to the various diffusion steps.

DETAILED DESCRIPTION

Figure 3A:
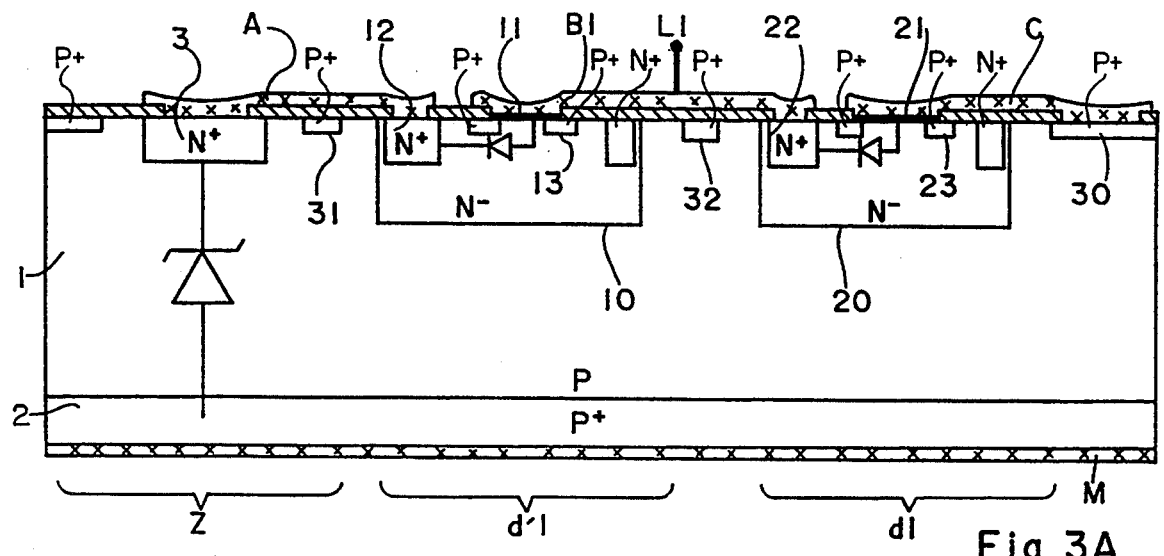
FIGS. 3A and 3B are, respectively, a cross sectional view and a schematic top view of an integrated circuit according to the invention, FIG. 3A being a cross-sectional view along line A—A of FIG. 3B.

FIG. 3A shows an integrated circuit formed from a P-type substrate 1 having its lower surface coated with an overdoped layer 2 (in practice, layer 2 can be formed by overdoping a substrate P, or reciprocally, the P-type region 1 can be epitaxially formed on a P+-type substrate which is then thicker than this layer).

Figure 1:
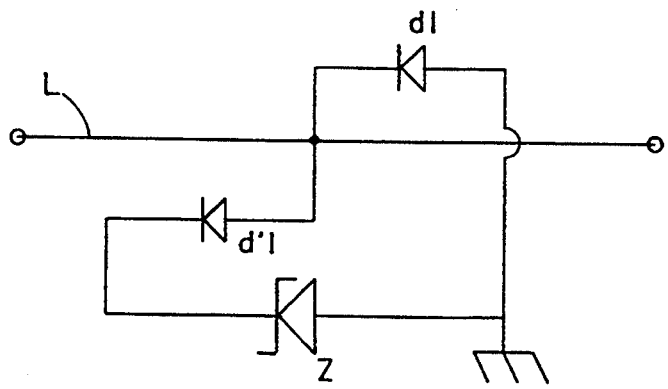
FIGS. 1 and 2, above described, are diagrams of protection circuits according to the prior art.
Figure 2:
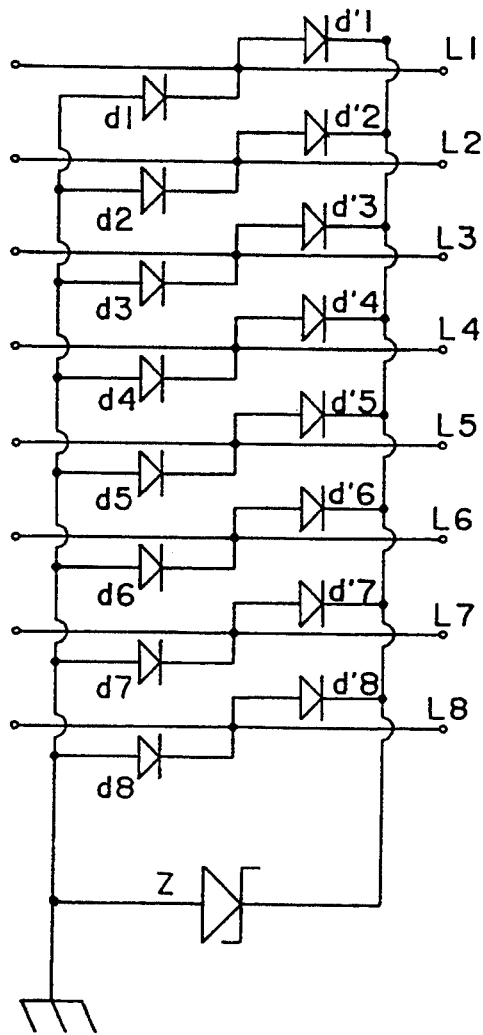

The cross-sectional view of FIG. 3A illustrates, from left to right, an avalanche diode Z, a diode d'1 and a diode d1 in accordance with the drawing of FIG. 1.

The avalanche diode Z is of the vertical type and is formed between an N-type highly doped region 3 and substrate 1.

Diodes d'1 and d1 are formed in low doped N-type wells 10 and 20 on the upper surface of which are deposited metallizations 11 and 21 forming with these wells Schottky barriers. Overdoped regions 12 and 22 provide ohmic contacts with wells 10 and 20.

A first metallization A establishes a connection between regions 3 and 12 and corresponds to the connection between the cathode of diode d'1 and the cathode of the avalanche diode Z.

A second metallization B1 establishes a contact between region 22 and metallization 11 and corresponds to the connection between the anode of diode d'1 and the cathode of diode d1. It is this metallization that will be connected to a line L1 to be protected.

Lastly, a third metallization C is connected to metallization 21 that forms a Schottky barrier with well 20. Metallization C provides a contact for connecting the anodes of Schottky diodes d1–d8 to ground.

The rear surface of the substrate is also coated with metallization (metallization M). Metallization M, which is connected to ground, is normally deposited on the metal base of a case. Metallization C, which must also be connected to ground, can be connected by a wire to this base and/or can, as shown, be extended to contact an overdoped superficial region 30 of substrate 1. The contact to ground is achieved through layers 30, 1 and 2 of the same doping type up to metallization M.

Various improvements appear in FIG. 3A. Especially, more highly doped P-type regions are disposed between each N-type region formed from the upper surface, that is, a first stop-channel region 31 between wells 3 and 10, and a second stop-channel region 32 between wells 10 and 20. In addition, preferably a P-type guard ring 13, 23 surrounds the areas where the Schottky barrier metallizations 11 and 21 contact the wells. Conventionally, the various metallizations lay on oxide areas that have previously served as a mask at the positions where they are not in contact with specific regions in the manner previously described.

Figure 3B:
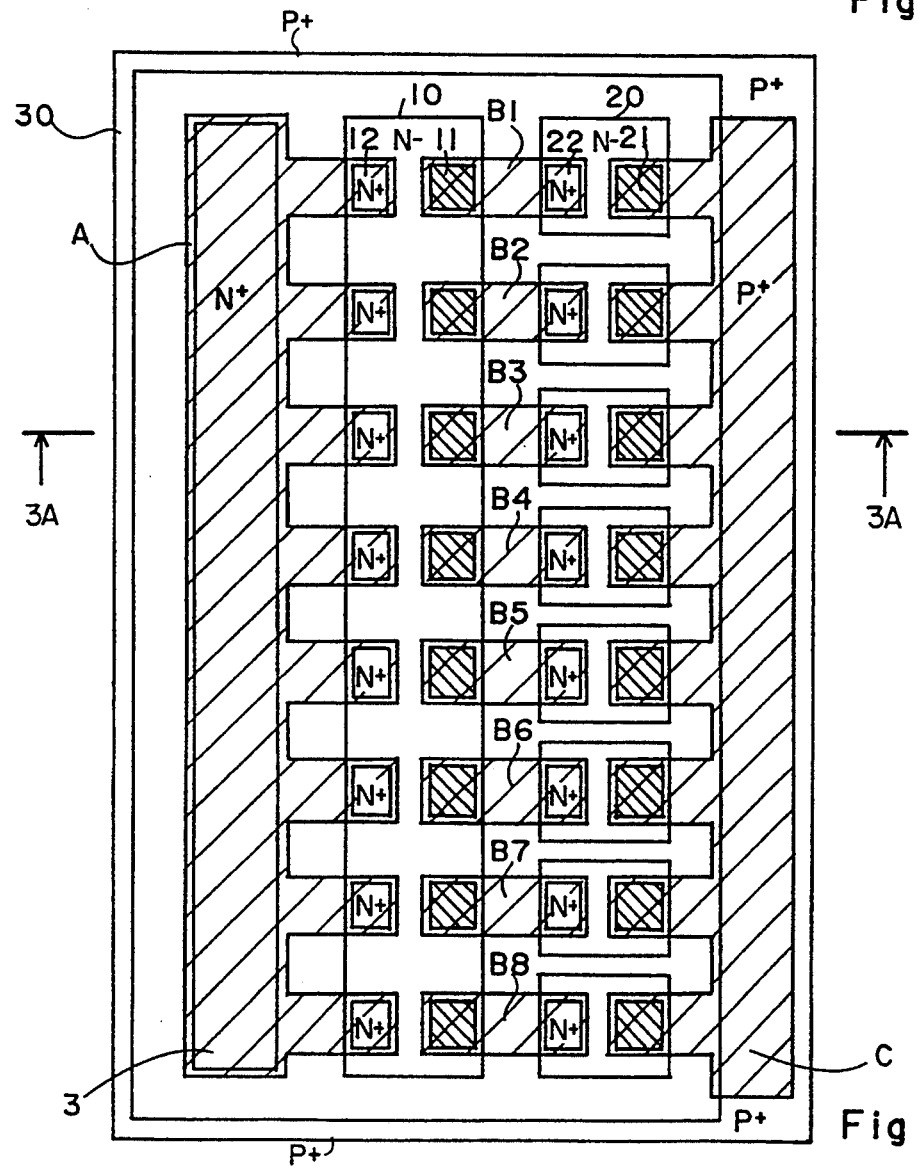

FIG. 3B is an exemplary top view of a circuit according to the invention. The same regions as in FIG. 3A are designated with the same reference numerals. For the sake of simplification, the guard ring and stop-channel areas are not shown. FIG. 3B shows again metallization A connecting each cathode of diodes d'1 (regions 12) to the cathode of the zener diode (region 3). Metallizations B1–B8, intended to be connected to lines L1–L8, connect regions 22 to metallizations 11. It is also to be noted that a single well 10 can be used for all diodes d'1–d'8 whereas each diode d1–d8 is provided in a separate well. Metallization C connects metallizations 21 to P+ region 30.

The circuit of FIG. 3B is preferably disposed in a case provided with terminals, each of which is connected, for example with a gold filament, to each metallization B1–B8. Conventionally, before wires are welded, the component will have been coated with a passivation layer (silicon nitride or polyimide) and apertures will be formed in this layer above metallizations B1–B8 where contacts are desired to be established. Two apertures per metallization can be provided for connection to a line input terminal and a line output terminal.

Of course the present invention is liable of various variants and improvements which will appear to those skilled in the art, who will more particularly be able to realize Schottky barriers according to various known techniques.

In addition, a protection circuit having all its polarities reversed could be achieved by inverting all the conductivity types of the layers of the described structure.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A protection diode array, comprising:
   a low doped substrate of a first conductivity type having a highly doped lower surface;
   first and second groups of low doped wells of a second conductivity type formed in an upper surface of the substrate;
   an ohmic contact and a Schottky contact on each well;
   a highly doped region of the second conductivity type on the upper surface of the substrate;
   a first metallization coupling the ohmic contacts of the first group of wells to the highly doped region of the second conductivity type;
   a second metallization coupling the Schottky contacts of the second group of wells together;
   a plurality of third metallizations, each of the plurality of third metallizations respectively coupling a Schottky contact of the first group of wells to an ohmic contact of the second group of wells; and
   a fourth metallization disposed on a rear surface of the substrate.

2. The protection diode array of claim 1, wherein the rear surface and the second metalization are coupled to a reference voltage, and each third metalization is coupled to a line to be protected.

3. The integrated circuit of claim 1, wherein the first wells form one single well.

4. The integrated circuit of claim 1, wherein each of the second wells is separated from the adjacent wells and from the first wells by a stop-channel region.

5. The integrated circuit of claim 1, wherein each of the Schottky contacts is surrounded by a guard ring.

6. The integrated circuit of claim 1, wherein the second metallization and the reference voltage are connected by a contact between the second metallization and an over doped region of the substrate upper surface.

7. The integrated circuit of claim 1, wherein the first conductivity type is P-type and the second conductivity type is N-type.

8. The protection diode array of claim 1, wherein the first conductivity type is N-type and the second conductivity type is P-type.

9. A protection diode array, comprising:

a low doped P-type substrate having a highly doped lower surface;

first and second groups of low doped N-type wells formed in an upper surface of the substrate;

an ohmic contact and a Schottky contact on each well;

a highly doped N-type region on the upper surface of the substrate;

a first metallization coupling the ohmic contacts of the first group of wells to the highly doped N-type region;

a second metallization coupling the Schottky contacts of the second group of wells together;

a plurality of third metallizations, each of the plurality of third metallizations respectively coupling a Schottky contact of the first group of wells to an ohmic contact of the second group of wells; and a fourth metallization disposed on a rear surface of the substrate.

10. The protection diode array of claim 9, wherein the rear surface and the second metalization are coupled to a reference voltage, and each third metalization is coupled to a line to be protected.

11. The protection diode array of claim 9, wherein the first wells form one single well.

12. The protection diode array of claim 9, wherein each of the second wells is separated from the adjacent wells and from the first wells by a stop-channel region.

13. The protection diode array of claim 9, wherein each of the Schottky contact is surrounded by a guard ring.

14. The protection diode array of claim 9, wherein the second metallization and the reference voltage are connected by a contact between the second metallization and an over doped region of the substrate upper surface.

15. An integrated circuit including an array of diodes, comprising a first plurality of Schottky diodes, each of the first plurality of Schottky diodes having an anode and a cathode, wherein each cathode is respectively connected to a point to be protected and each anode is connected to a reference voltage, and a second plurality of Schottky diodes, each of the second plurality of Schottky diodes having an anode and a cathode, wherein each anode is respectively connected to the point to be protected and each cathode is connected to a cathode of an avalanche diode, the avalanche diode also having an anode connected to the reference voltage, the integrated circuit comprising:

a low doped P-type substrate having a highly doped lower surface;

first and second groups of low doped N-type wells formed in an upper surface of the substrate;

an ohmic contact and a Schottky contact on each well;

a highly doped N-type region on the upper surface of the substrate;

a first metallization connecting the ohmic contacts of the first group of wells to the highly doped N-type region;

a second metallization connecting the Schottky contacts of the second group of wells together;

a plurality of third metallizations, each of the plurality of third metallizations respectively connecting a Schottky contact of the first group of wells to an ohmic contact of the second group of wells; and a fourth metallization disposed on a rear surface of the substrate.

16. The integrated circuit of claim 15, wherein the rear surface and the second metalization are connected to a reference voltage and each third metalization is connected to a line to be protected.

17. The integrated circuit of claim 15, wherein the first group of wells form one single well.

18. The integrated circuit of claim 15, wherein each well of the second group of wells is separated from adjacent wells and from the first wells by a stop-channel region.

19. The integrated circuit of claim 15, wherein each of the Schottky contacts is surrounded by a guard ring.

20. The integrated circuit of claim 15, wherein the second metallization and the reference voltage are connected by a contact between the second metallization and an over doped region of the substrate upper surface.

* * * * *